(12) United States Patent
Santin

(10) Patent No.: US 6,930,936 B2
(45) Date of Patent: Aug. 16, 2005

(54) DATA COMPRESSION READ MODE FOR MEMORY TESTING

(75) Inventor: Giovanni Santin, Santa Rufina (IT)

(73) Assignee: Micron Technology, Inc., Boise, ID (US)

( * ) Notice: Subject to any disclaimer, the term of this patent is extended or adjusted under 35 U.S.C. 154(b) by 598 days.

(21) Appl. No.: 09/943,642

(22) Filed: Aug. 30, 2001

(65) Prior Publication Data

US 2002/0118580 A1 Aug. 29, 2002

(30) Foreign Application Priority Data

Feb. 27, 2001 (IT) .................................. RM2001A0104

(51) Int. Cl.⁷ .............................................. G11C 11/00
(52) U.S. Cl. .................. 365/201; 365/189.07; 714/719; 714/718
(58) Field of Search ............................ 365/201, 189.07; 714/718, 719

(56) References Cited

U.S. PATENT DOCUMENTS

| | | | | |
|---|---|---|---|---|
| 4,872,168 A | * | 10/1989 | Aadsen et al. | ............... 714/720 |
| 5,535,164 A | * | 7/1996 | Adams et al. | ............... 365/201 |
| 5,740,098 A | * | 4/1998 | Adams et al. | ................ 365/49 |
| 5,808,946 A | | 9/1998 | Roohparvar | |
| 5,913,928 A | | 6/1999 | Morzano | |
| 6,016,561 A | | 1/2000 | Roohparvar et al. | |
| 6,032,274 A | * | 2/2000 | Manning | .................... 714/718 |
| 6,072,737 A | | 6/2000 | Morgan et al. | |
| 6,550,026 B1 | * | 4/2003 | Wright et al. | ................ 714/719 |

FOREIGN PATENT DOCUMENTS

| | | | | | |
|---|---|---|---|---|---|
| JP | 405325598 A | * | 12/1993 | ........... | G11C/29/00 |
| JP | 408077797 A | * | 3/1996 | ........... | G11C/29/00 |

* cited by examiner

*Primary Examiner*—Viet Q. Nguyen
(74) *Attorney, Agent, or Firm*—Leffert Jay & Polglaze PA; Thomas W. Leffert

(57) ABSTRACT

Memory devices having a normal mode of operation and a test mode of operation are useful in quality programs. The test mode of operation includes a data compression test mode. In the data compression test mode, reading one word of an output page provides an indication of the data values of the remaining words of the output page. The time necessary to read and verify a repeating test pattern can be reduced as only one word of each output page need be read to determine the ability of the memory device to accurately write and store data values. The memory devices include data compression circuits to compare data values for each bit location of each word of the output page. Output is selectively disabled if a bit location for one word of the output page has a data value differing from any remaining word of the output page.

96 Claims, 5 Drawing Sheets

DATA COMPRESSION READ MODE FOR MEMORY TESTING

TECHNICAL FIELD OF THE INVENTION

The present invention relates generally to semiconductor memory devices, and in particular, the present invention relates to test methods for semiconductor memory devices as well as circuits and apparatus for implementing such methods.

BACKGROUND OF THE INVENTION

Electronic information handling or computer systems, whether large machines, microcomputers or small and simple digital processing devices, require memory for storing data and program instructions. Various memory systems have been developed over the years to address the evolving needs of information handling systems. One such memory system includes semiconductor memory devices.

Semiconductor memory devices are rapidly-accessible memory devices. In a semiconductor memory device, the time required for storing and retrieving information generally is independent of the physical location of the information within the memory device. Semiconductor memory devices typically store information in a large array of cells.

Computer, communication and industrial applications are driving the demand for memory devices in a variety of electronic systems. One important form of semiconductor memory device includes a non-volatile memory made up of floating-gate memory cells called flash memory. Flash memory is often used where regular access to the data stored in the memory device is desired, but where such data is seldom changed. Computer applications use flash memory to store BIOS firmware. Peripheral devices such as printers store fonts and forms on flash memory. Digital cellular and wireless applications consume large quantities of flash memory and are continually pushing for lower voltages and higher densities. Portable applications such as digital cameras, audio recorders, personal digital assistants (PDAs) and test equipment also use flash memory as a medium to store data.

Conventional flash memory cells make use of a floating-gate transistor including a source region, a drain region, a floating-gate layer and a control-gate layer. In such devices, access operations are carried out by applying biases to each of these terminals. Write operations are generally carried out by channel hot-carrier injection. This process induces a flow of electrons between the source and the drain, and accelerates them toward a floating gate in response to a positive bias applied to the control gate. Read operations generally include sensing a current between the source and the drain, i.e., the MOSFET current, in response to a bias applied to the control gate. Erase operations are generally carried out through Fowler-Nordheim tunneling. This process may include electrically floating the drain region, grounding the source region, and applying a high negative voltage to the control-gate layer.

Another important form of semiconductor memory device includes a volatile memory called dynamic random access memory (DRAM). DRAM is often used where rapid access to the memory array is desired for both data input and data output. DRAM has faster access times than flash memory, but requires periodic refresh to avoid losing its data values. Typical DRAM configuration includes an array of memory cells placed at the intersection of word lines and bit lines. Each memory cell includes an access transistor, with the gate of each access transistor coupled to a word line. A first source/drain region of an access transistor is coupled to a bit line and a second source/drain region of the access transistor is coupled to a first plate of a capacitor. The data value is stored as a charge on the capacitor and the data value is sensed by charge sharing with the associated bit line and detecting the change to the bit-line potential as a result of the charge sharing. Computer applications typically use DRAM to store program instructions and other temporary data.

Prior to shipping, a manufacturer may test its semiconductor memory devices as part of a quality program to improve end-use reliability. One of the tests performed includes a write verify test. Generally, the write verify test is used to test the ability of the memory array to receive, retain and output data reliably. Such tests typically first involve writing a pattern of data, e.g., an input pattern of 1s (ones) and 0s (zeros), to the memory array. The memory array is subsequently accessed to sense and output the data stored in the memory array. The data is often output as a page of data containing two or more words with each word containing some number of bits. The output data is then compared to the pattern of data originally input to the memory array on a bit-by-bit basis, and generally one word at a time, by an arbitration circuit of a testing apparatus. If each bit of each word of the output data matches the corresponding bit of the input pattern, the device passes the test. A mismatch between any bit of any word of the output data and the input pattern is indicative of a device failure. These tests, while valuable to verify device reliability, are time consuming and expensive.

For the reasons stated above, and for other reasons stated below that will become apparent to those skilled in the art upon reading and understanding the present specification, there is a need in the art for alternative methods of testing memory devices, circuits for implementing such test methods, and memory devices making use of such circuits and test methods.

SUMMARY OF THE INVENTION

The above-mentioned problems with memory devices and other problems are addressed by the present invention and will be understood by reading and studying the following specification.

Testing of memory devices is generally performed as part of a quality program to improve end-use reliability. The memory devices described herein are capable of a normal mode of operation and a test mode of operation. The test mode of operation includes a data compression test mode wherein reading one word of an output page provides as indication of the data values of the remaining words of the output page. In this manner, read time of a memory array having a repeating pattern can be reduced to a fraction of the required to read every word of the array. Consequently, the time required for testing the ability of a memory device to accurately store data can be reduced.

For one embodiment, the invention provides a data compression circuit in a memory device. The data compression circuit includes a first logic circuit for receiving data signals corresponding to a given bit location of each word of an output page of the memory device and for providing a first output signal indicative of whether each data signal has a first logic level. The data compression circuit further includes a second logic circuit for receiving the data signals corresponding to the given bit location of each word of the output page of the memory device and for providing a second output signal indicative of whether each data signal has a second logic level different from the first logic level. The data compression circuit still further includes a third logic circuit for receiving the first output signal and the second output signal and for providing a third output signal indicative of whether each data signal has the same logic level.

For a further embodiment, the first logic circuit includes a plurality of first buffer stages. Each first buffer stage has an input for receiving a data signal for a given bit location of a word of an output page of the memory device, and an output. Each first buffer stage is coupled to receive a data signal for the given bit location of a different word of the output page and each first buffer stage has its output coupled to the outputs of the remaining first buffer stages. Each first buffer stage sinks a first current level in response to a data signal having a logic high level and drives a second, larger, current level in response to a data signal having a logic low level. The second current level for one first buffer stage is larger in magnitude than the first current level for each remaining first buffer stage combined.

For a still further embodiment, the second logic circuit includes a plurality of second buffer stages. Each second buffer stage has an input for receiving a data signal for the given bit location of a word of the output page of the memory device, and an output. Each second buffer stage is coupled to receive a data signal for the given bit location of a different word of the output page and each second buffer stage has its output coupled to the outputs of the remaining second buffer stages. Each second buffer stage sinks a first current level in response to a data signal having a logic high level and drives a second, smaller, current level in response to a data signal having a logic low level. The first current level for one second buffer stage is larger in magnitude than the second current level for each remaining second buffer stage combined.

For another embodiment, the invention provides a memory device. The memory device includes a data compression circuit having a plurality of inputs for receiving data signals and an output for providing a first control signal. The data compression circuit has its inputs coupled to receive data signals representative of data values for a given bit location of each word of a page of output of the memory device. The first control signal has a first logic level when the data signals for the given bit location match and a second logic level when any data signal for the given bit location differs. The memory device further includes an output driver circuit for providing an output signal indicative of a data signal. The output driver circuit is disabled when the first control signal has the second logic level. For a further embodiment, the memory device is coupled to a processor to receive external control signals and to bi-directionally communicate data values.

For yet another embodiment, the invention provides a method of testing a memory device. The method includes accessing a memory array to generate a page of output containing at least two words. The page of output has a repeating data pattern and each word has at least one bit location. The method further includes comparing data signals for a given bit location of each word of the page of output and disabling output for data signals corresponding to at least the given bit location if at least one data signal for the given bit location differs from any remaining data signal for the given bit location. The method still further includes attempting to read a word of the page of output and determining whether output is disabled for at least the given bit location. Disabled output is indicative of failure of the memory device.

The invention further provides methods and apparatus of varying scope.

DETAILED DESCRIPTION OF THE INVENTION

In the following detailed description of the present embodiments, reference is made to the accompanying drawings that form a part hereof, and in which is shown by way of illustration specific embodiments in which the invention may be practiced. These embodiments are described in sufficient detail to enable those skilled in the art to practice the invention, and it is to be understood that other embodiments may be utilized and that process, electrical or mechanical changes may be made without departing from the scope of the present invention. The terms wafer or substrate used in the following description include any base semiconductor structure. Examples include silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and the terms wafer and substrate include the underlying layers containing such regions/junctions. The following detailed description is, therefore, not to be taken in a limiting sense, and the scope of the present invention is defined only by the appended claims and equivalents thereof.

Although the testing methods and data compression circuits described herein are applicable to a variety of memory device types, including various forms of volatile and non-volatile memory devices known in the art, such methods and compression circuits will be described in relation to a flash memory device. Those skilled in the art will readily recognize their applicability to other memory devices providing page output containing two or more words.

Figure 1A:
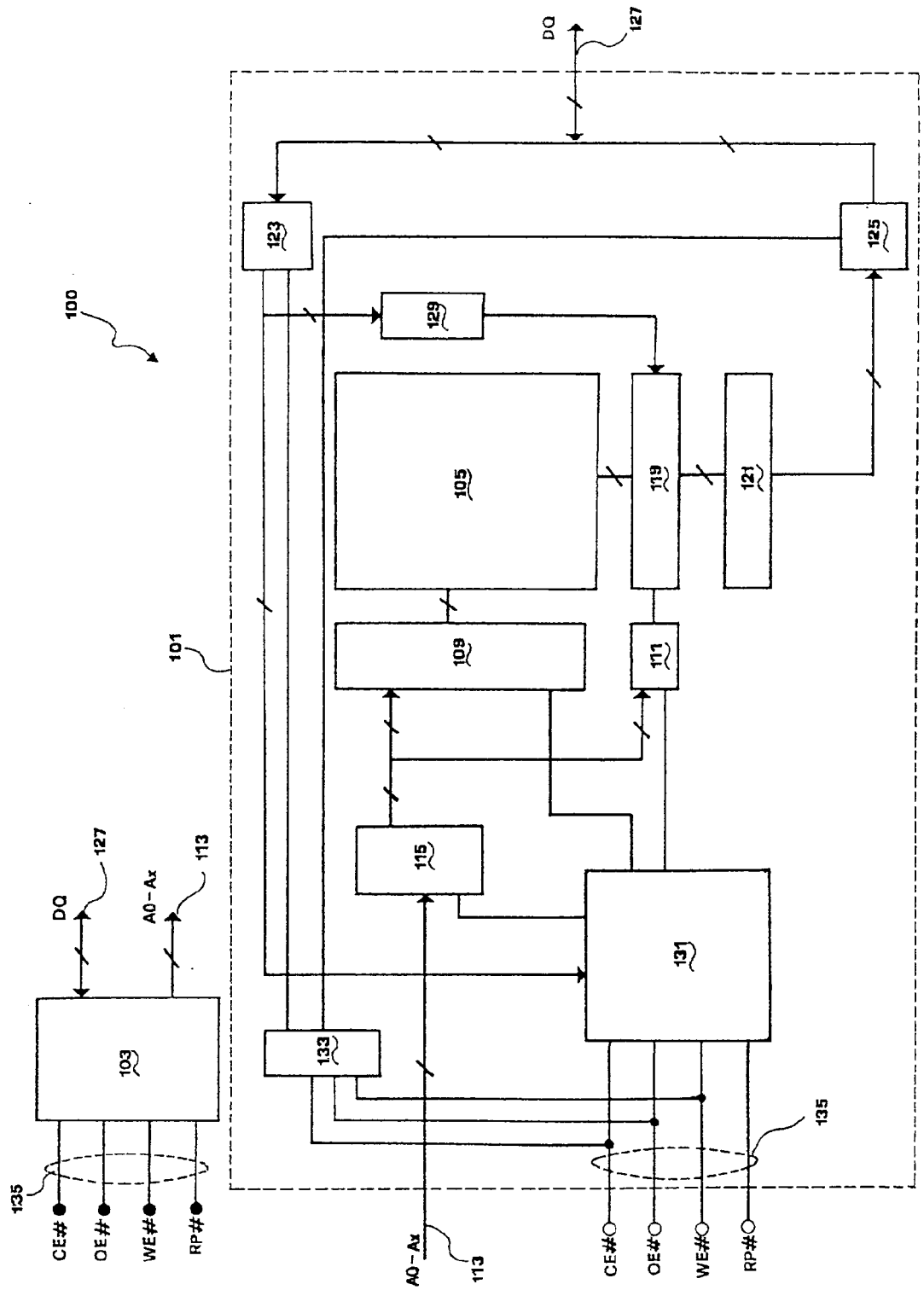
FIG. 1A is a functional block diagram of a basic flash memory device coupled to a processor in accordance with an embodiment of the invention.

FIG. 1A is a functional block diagram of a basic flash memory device 101 that is coupled to a processor 103. The memory device 101 and the processor 103 may form part of an electronic system 100. The memory device 101 has been simplified to focus on features of the memory that are helpful in understanding the present invention. The memory device 101 includes an array of memory cells 105. The memory cells of the memory device 101 may be non-volatile floating-gate memory cells. The memory array 105 is arranged in rows and columns, with the rows arranged in blocks. A memory block is some discrete portion of the memory array 105. Individual word lines generally extend to only one memory block while bit lines may extend to multiple memory blocks. The memory cells generally can be erased in blocks. Data, however, may be stored in the memory array 105 separate from the block structure.

A row decoder 109 and a column decoder 111 are provided to decode address signals provided on address lines A0–Ax 113. An address buffer circuit 115 is provided to latch the address signals. Address signals are received and decoded to access the memory array 105. A column select circuit 119 is provided to select a column of the memory array 105 in response to control signals from the column decoder 111. Sensing circuitry 121 is used to sense and amplify data stored in the memory cells. Data input 123 and output 125 buffer circuits are included for bi-directional data communication over a plurality of data (DQ) lines 127 with the processor 103. A data latch 129 is typically provided between data input buffer circuit 123 and the column select circuit 119 for storing data values (to be written to a memory cell) received from the DQ lines 127. Data amplified by the sensing circuitry 121 is provided to the data output buffer circuit 125 for output on the DQ lines 127. The data output buffer circuit 125 includes a data compression circuit in accordance with the embodiments of the invention.

Command control circuit 131 decodes signals provided on control lines 135 from the processor 103. These signals are used to control the operations on the memory array 105, including data read, data write, and erase operations. Input/output control circuit 133 is used to control the data input buffer circuit 123 and the data output buffer circuit 125 in response to some of the control signals.

Semiconductor memory devices are generally fabricated on semiconductor substrates. Each of these substrates typically contains a number of individual semiconductor memory devices formed in rectangular areas known as dies. After fabrication, each die is separated, or diced, then packaged in a format suitable for the end user. As stated above, the flash memory device 101 has been simplified to facilitate a basic understanding of the features of the memory. A more detailed understanding of flash memories is known to those skilled in the art.

Figure 1B:
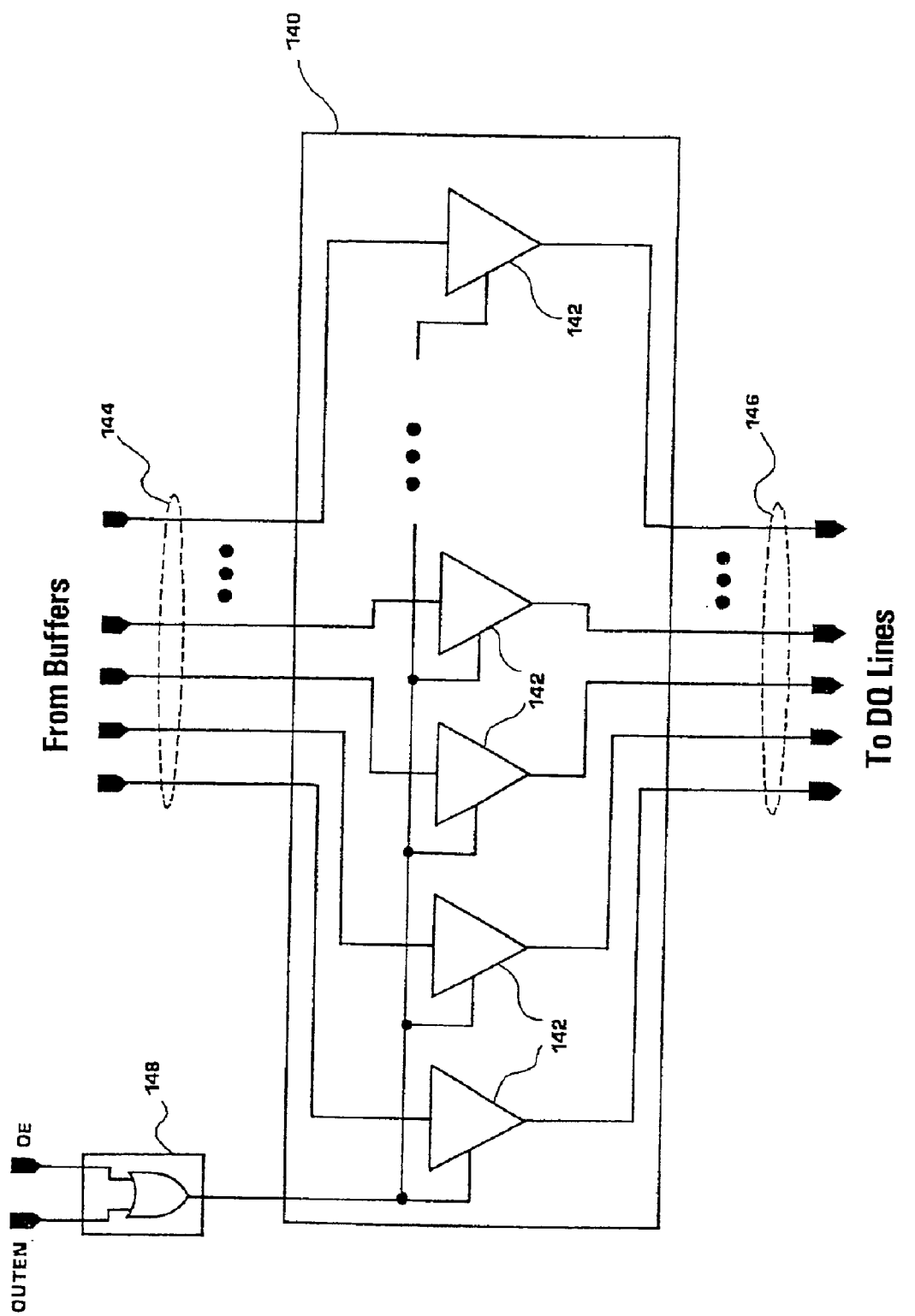
FIG. 1B is a functional block diagram of an output driver stage for use in the memory device of FIG. 1A in accordance with one embodiment of the invention.

The data output buffer circuit 125 typically includes an output driver stage having an output driver circuit for each DQ line 127. FIG. 1B is a functional block diagram of an output driver stage 140 for use with the memory device 101 of FIG. 1A in accordance with one embodiment of the invention. The output driver stage 140 includes one or more output driver circuits 142. Inputs 144 of the output driver circuits 142 receive the data signals, such as from buffers of the data output buffer circuit 125. There is one input 144 corresponding to each bit location of a word and thus to each DQ line 127. Outputs 146 of the output driver circuits 142 are associated with and coupled to each DQ line 127 in a one-to-one relationship. Each output driver circuit 142 is responsive to an output enable signal provided by the processor 103, such as the external control signal OE#, and to an inhibit signal, such as the internal control signal OUTEN. FIG. 1B depicts combining a global output enable signal OE# and a global inhibit signal OUTEN in a logic circuit 148, and providing the combined control signal to each output driver circuit 142.

The global inhibit signal OUTEN may be generated by combining the local inhibit signal from each data compression circuit in another logic circuit, such as an OR gate. In this manner, if one data compression circuit indicates that its given bit location has failed, all output driver circuits 142 may be simultaneously disabled. Alternatively, separate output enable signals and inhibit signals can be applied to each output driver circuit 142 to selectively disable only that output driver circuit 142 corresponding to the failed bit location. In addition, the output enable signal and the inhibit signal can be individually applied to each output driver circuit 142, provided each output driver circuit 142 is adapted to respond to two control signals as described herein, e.g., permitting disabling of an output driver circuit 142 in response to a logic level of the inhibit signal regardless of a logic level of the output enable signal.

As is well known in the art, an output driver circuit 142 may include a tri-state buffer circuit having three possible output states. In a first state, the output driver circuit 142 provides a first potential level, such as a supply potential, indicative of a first logic level. In a second state, the output driver circuit 142 provides a second potential level, such as a ground potential, indicative of a second logic level. In a third state, the output driver circuit 142 provides a high impedance level. The output driver circuit 142 is placed in the third state when data output is disabled. In the absence of an inhibit signal, the output driver circuit 142 is generally responsive to both a data signal and an output enable signal. When the output enable signal has a first logic value, such as a logic high level, the output driver circuit 142 is disabled, thereby presenting a high impedance level regardless of the logic level of the data signal. When the output enable signal has a second logic level, such as a logic low level, the output driver circuit 142 may be enabled to present either the first potential level or the second potential level indicative of the logic level of the data signal. The command control circuit 131 provides the additional control signal to the data output buffer circuit 125 to selectively disable the output driver circuit regardless of the logic level of the output enable signal; this inhibit signal is generated by a data compression circuit as described herein.

As mentioned earlier, a write verify test may be used to test the ability of the memory array to receive, retain and output data reliably. Such tests typically first involve writing a pattern of data, e.g., an input pattern of 1s and 0s, to the memory array. The input pattern is often a repeating pattern, with each word of the input page having the same pattern. For example, for a page containing two 8-bit words, the pattern may be all zeros "0000000000000000," all ones "1111111111111111", checkerboard "0101010101010101" or reverse checkerboard "1010101010101010." In general terms, in a repeating pattern for a page having two or more words, every bit of a first word has the same data value as its corresponding bit of each remaining word such that each word has the same data pattern. Stated alternatively, for a page having M words of N bits each, $bit_n = bit_{mN+n}$ for each value of m and n, where m is some integer value from 0 to M−1 and n is some integer value from 0 to N−1.

While each word of data output in page mode is accessed and sensed in parallel, the data is generally output on the DQ lines in serial fashion as the number of DQ lines is generally less than the number of bits in a page. During testing, a testing apparatus will typically compare each word of the page as it is provided on the DQ lines. The various embodiments of the invention provide for reduced testing time by eliminating the need for the testing apparatus to read each word of the output page in order to determine data accuracy. For one embodiment of the invention, the testing apparatus compares only the first word of the output page to a word of the input pattern. Such a reduction in testing time is facilitated by providing a data compression test mode within the memory device.

In the data compression test mode, the data value of the $n^{th}$ bit location of a first word is compared with the data value of the $n^{th}$ bit location of each remaining word. This comparison is performed internal to the memory device. An output signal having a first logic level is generated if every $n^{th}$ bit is identical, whether a 0 or a 1. The output signal is generated having a second logic level if at least one of the $n^{th}$ bits is different from the $n^{th}$ bit of the first word. The output signal of the data compression test mode may be used as an inhibit signal to selectively inhibit or permit the output driver circuit to provide the output word, e.g., the first word, on the DQ lines in response to the output enable signal OE#. As an example, when the inhibit signal has the first logic level, the output driver circuit is responsive to the output enable signal OE#. But, when the inhibit signal has the second logic level, the output driver circuit is disabled regardless of the value of the output enable signal OE#. In this manner, the output word is provided on the DQ lines only when every $n^{th}$ bit matches, provided the output driver circuit is not disabled by the output enable signal OE#. The testing apparatus can thus recognize a failed test condition by the absence of data on one or more of the DQ lines when the output enable signal OE# is indicative of a desire to enable data output. If data is present on each DQ line, the testing apparatus can then compare the output word with a word of the input data pattern on a bit-by-bit basis. If all bits match, the test is acceptable. Conversely, if there is a mismatch between any bit of the output word and its corresponding bit of the input data pattern, the test is failed.

Figure 2A:
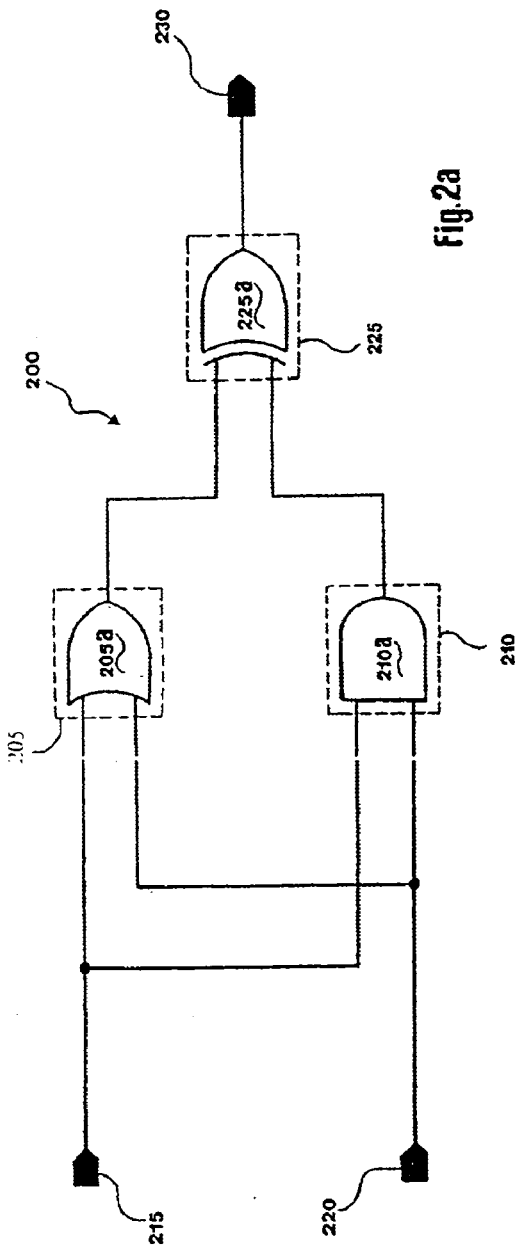
FIGS. 2A–2B are logic diagrams of data compression circuits in accordance with embodiments of the invention.
Figure 2B:
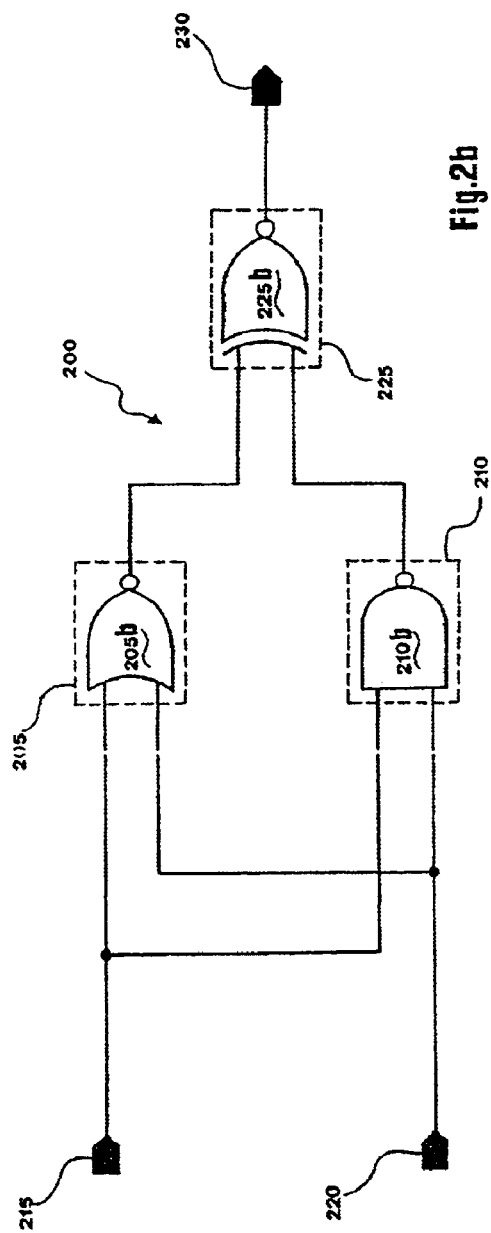

FIGS. 2A–2B are logic diagrams of data compression circuits 200 in accordance with embodiments of the invention. Data compression circuits 200 are logic circuits for comparing the $n^{th}$ bit of each word of the page. The data compression circuits 200 may be a part of the command control circuit 131. In general, the data compression circuits 200 include a first logic circuit 205 and a second logic circuit 210. The first logic circuit 205 and the second logic circuit 210 each receive an $n^{th}$ bit of each word of the page as inputs from input nodes 215 and 220. For a page having M words of N bits each, N data compression circuits 200 generally would be used. Although the data compression circuits 200 show only two input nodes 215 and 220 corresponding to two words, other numbers of words could be accommodated by increasing the number of input nodes. For a page having M words of N bits each, each data compression circuit 200 would generally include M input nodes.

The output of the first logic circuit 205 has a first logic level if all of the inputs are a logic low level and a second logic level if any input has a logic high level. The output of the second logic circuit 210 has a first logic level if all of the inputs are a logic high level and a second logic level if any input has a logic low level. As shown in FIG. 2A, an example logic circuit for the first logic circuit 205 includes an OR gate 205a and an example logic circuit for the second logic circuit 210 includes an AND gate 210a. As shown in FIG. 2B, an example logic circuit for the first logic circuit 205 includes a NOR gate 205b and an example logic circuit for the second logic circuit 210 includes a NAND gate 210b.

The outputs of the first logic circuit 205 and the second logic circuit 210 are combined as inputs to a third logic circuit 225. The third logic circuit 225 produces an output having a first logic level if the output logic levels of the first logic circuit 205 and the second logic circuit 210 match. The third logic circuit 225 produces an output having a second logic level if the output logic levels of the first logic circuit 205 and the second logic circuit 210 differ. As shown in FIGS. 2A–2B, example logic circuits for the third logic circuit 225 include an XOR gate 225a and an XNOR gate 225b. The result is an output signal presented on node 230 having a first logic level if the data values for a given bit location of each word match and a second logic level if at least one data value for the given bit location does not match the remaining data values for the given bit location.

The first logic level of the first logic circuit 205 and the first logic level of the second logic circuit 210 may be the same logic level. As an example, the first logic circuit 205 could be an OR gate 205a having a logic low level for its first logic level and the second logic circuit 210 could be a NAND gate 210b having a logic low level for its first logic level. Choice of the third logic circuit 225 is generally dependent upon the desired logic level of the output signal on node 230. For the preceding example, the third logic circuit 225 will receive a logic high level and a logic low level on its inputs if all data values match for the given bit location and it will receive two logic high levels on its input if any data value for the given bit location differs. If an output signal having a logic high level is desired to indicate matching data values, an XOR gate 225a could be used. If a logic low level is desired to indicate matching data values, an XNOR gate 225b could be used. Other combinations of logic circuits may be used to produce the appropriate output signal on node 230.

Figure 3A:
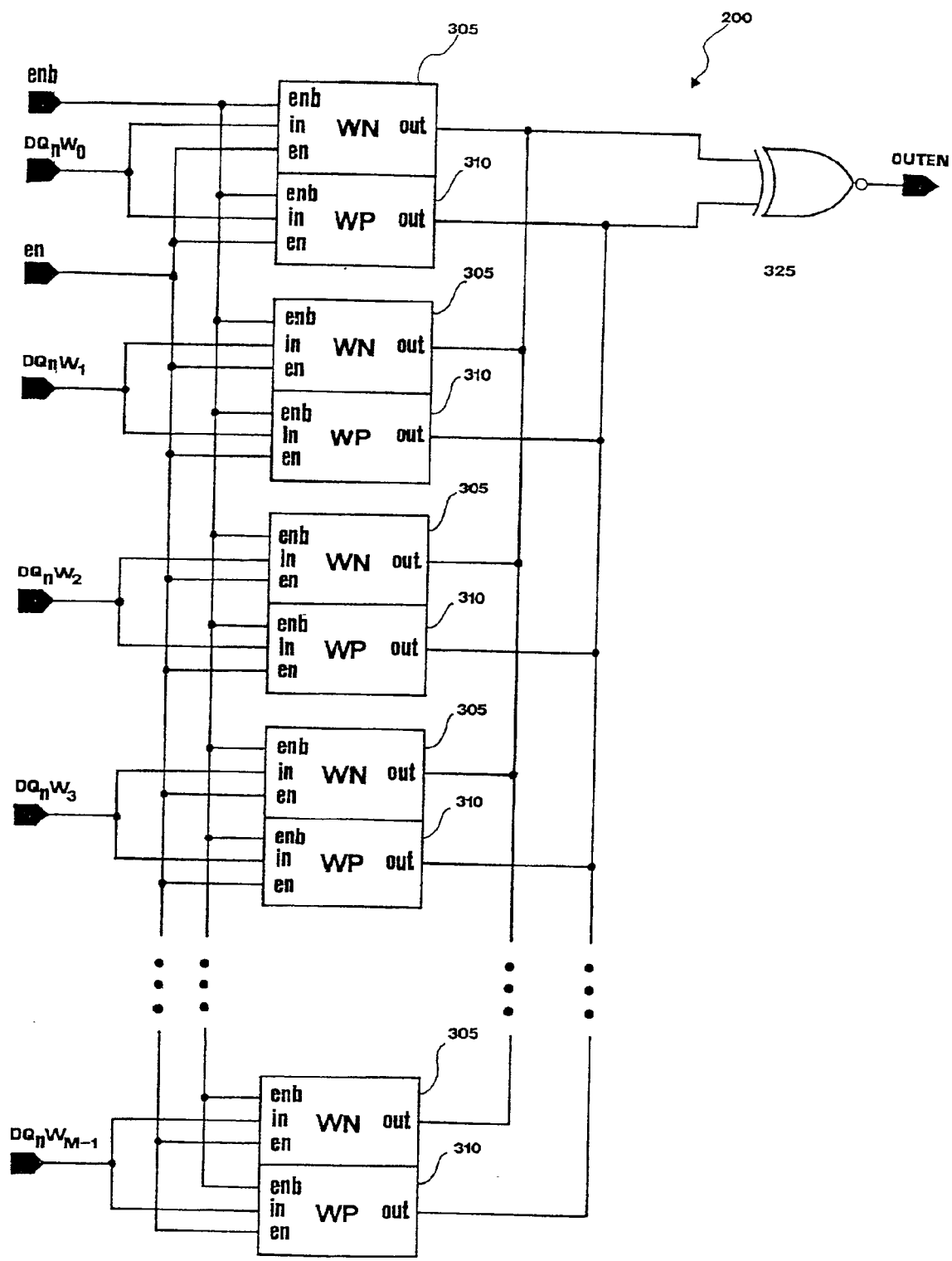
FIG. 3A is a block diagram of a data compression circuit in accordance with another embodiment of the invention.

FIG. 3A is a block diagram of a data compression circuit 200 in accordance with another embodiment of the invention. The data compression circuit 200 of FIG. 3A includes a first buffer stage 305 and a second buffer stage 310 for each word of the output page. The first buffer stages 305 have their outputs commonly coupled to a first input of the logic circuit 325. The second buffer stages 310 have their outputs commonly coupled to a second input of the logic circuit 325. The first buffer stages 305 collectively may be thought of as the first logic circuit 205 while the second buffer stages 310 collectively may be thought of as the second logic circuit 210. The logic circuit 325 generates an output signal OUTEN having a first logic level if both inputs are the same and a second logic level if the inputs differ. For the XNOR gate shown as logic circuit 325 in FIG. 3A, the output signal OUTEN has a logic high level if both inputs are the same, whether logic low or logic high, and the output signal OUTEN has a logic low level if one input has a logic low level and the other input has a logic high level.

Each first buffer stage 305 produces an output signal driving a first current level when a logic low level is presented at its input and an output signal capable of sinking a second, lesser, current level when a logic high level is presented at its input. The first current level of each first buffer stage 305 is chosen such that it is greater than the sum of the second current levels for each remaining first buffer stage 305. As an example, for a page containing eight words, the first current level of a first buffer stage 305 is greater than seven times the second current level. In this manner, the combined output of the first buffer stages 305 is a logic high level if at least one data signal on inputs 315 has a logic low level; the current drive of one first buffer stage 305 cannot be overcome by the combined current sink of all remaining first buffer stages 305. Likewise, the combined output of the first buffer stages 305 is a logic low level only if all data signals on inputs 315 have a logic high level. For one embodiment, the first current level of the first buffer stages 305 is chosen to be much greater than the second current level of the first buffer stages 305 to reduce the response time of their combined output. For a further embodiment, the first current level is chosen relative to the second current level such that a response time for a transition of the combined signal of the first buffer stages 305 from a logic low level to a logic high level is less than approximately 10 nS.

Each second buffer stage 310 produces an output signal driving a first current level when a logic low level is presented at its input and an output signal capable of sinking a second, greater, current level when a logic high level is presented at its input. The second current level of each second buffer stage 310 is chosen such that it is greater than the sum of the first current levels for each remaining second buffer stage 310. As an example, for a page containing eight words, the second current level of a second buffer stage 310 is greater than seven times the first current level. In this manner, the combined output of the second buffer stages 310 is a logic low level if at least one data signal on inputs 315 has a logic high level; the current sink of one second buffer stage 310 cannot be overcome by the combined current drive of all remaining second buffer stages 310. Likewise, the combined output of the second buffer stages 310 is a logic high level only if all data signals on inputs 315 have a logic low level. For one embodiment, the second current level of the second buffer stages 310 is chosen to be much greater than the first current level of the second buffer stages 310 to reduce the response time of their combined output. For a further embodiment, the second current level is chosen relative to the first current level such that a response time for a transition of the combined signal of the second buffer stages 310 from a logic high level to a logic low level is less than approximately 10 nS.

Figure 3C:
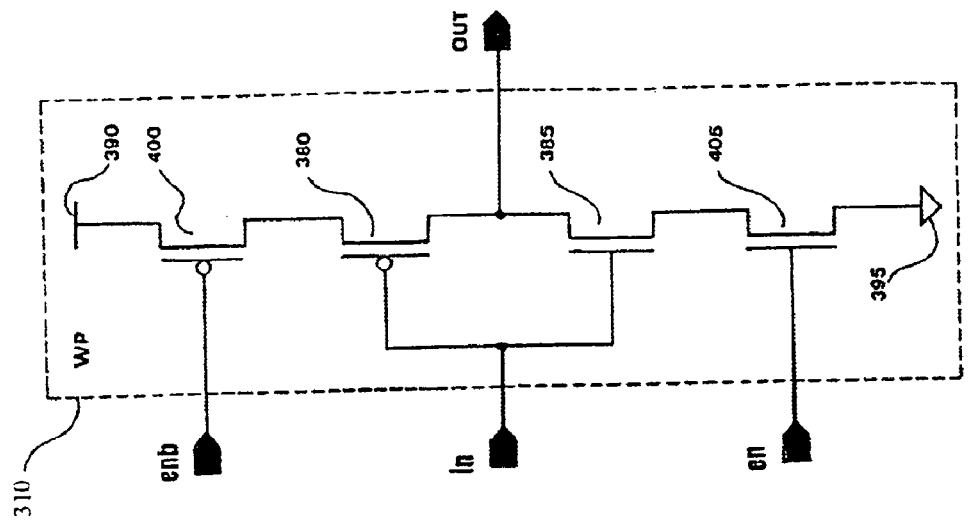
FIG. 3C is a schematic of a second buffer stage for use in the data compression circuit of FIG. 3A in accordance with an embodiment of the invention.
Figure 3B:
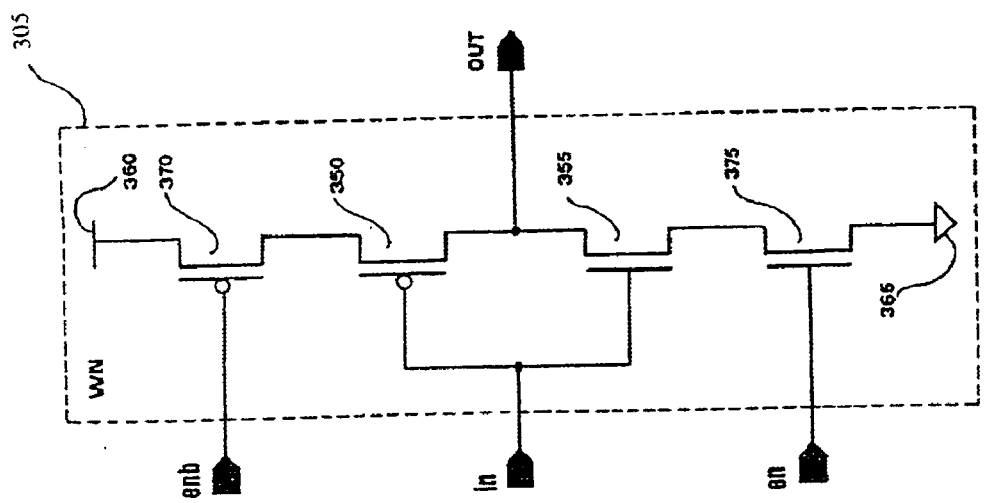
FIG. 3B is a schematic of a first buffer stage for use in the data compression circuit of FIG. 3A in accordance with an embodiment of the invention.

FIGS. 3B and 3C show schematics of a first buffer stage 305 and a second buffer stage 310, respectively, for use in the data compression circuit 200 of FIG. 3A in accordance with one embodiment of the invention. The first buffer stage 305 includes a first p-channel field-effect transistor (pFET) 350 and a first n-channel field-effect transistor (nFET) 355 coupled in series between a first potential node 360 and a second potential node 365. The first potential node 360 is coupled to receive a first potential and the second potential node 365 is coupled to receive a second potential lower than the first potential. The first potential node 360 may be coupled to receive a supply potential such as Vcc. The second potential node 365 may be coupled to receive a ground potential such as Vss.

The first pFET 350 and the first nFET 355 each have their drains coupled to the output of the first buffer stage 305 and their gates coupled to the input of the first buffer stage 305 for receiving the data signal. The first nFET 355 is a weak n-channel device such that its conductance at activation is low relative to the conductance at activation of the first pFET 350. The result is that the first nFET 355 is capable of sinking a relatively small current at activation while the first pFET 350 is capable of conducting a relatively large current at activation. For one embodiment, the first nFET 355 has a W/L ratio that is smaller than a W/L ratio of the first pFET 350. For a further embodiment, the first nFET 355 has a W/L ratio of approximately 3/10 while the first pFET 350 has a W/L ratio of approximately 40/1.

The data compression circuits 200 should be disabled in normal operation and enabled only during the desired testing. One method of disabling the data compression circuits 200 can include disabling each first buffer stage 305. As shown in FIG. 3B, the first buffer stage 305 further includes a second pFET 370 and a second nFET 375. The second pFET 370 is coupled between the first potential node 360 and the first pFET 350 and has its gate coupled to receive a first enable signal enb. The second nFET 375 is coupled between the second potential node 365 and the first nFET 355 and has its gate coupled to receive a second enable signal en. The second enable signal en may be the binary complement of the first enable signal enb such that the second pFET 370 and the second nFET 375 are either both activated or both deactivated. The second pFET 370 and the second nFET 375 should be activated during the data compression test mode and deactivated during normal operation of the memory device. Deactivation of the second pFET 370 and the second nFET 375 disables the first buffer stage 305, thereby presenting a high impedance level at its output. For one embodiment, the second pFET 370 has the same width as the first pFET 350 and the second nFET 375 has the same width as the first nFET 355. Choosing the same width of these adjacent transistors simplifies fabrication of the transistors on a semiconductor substrate. For a further embodiment, the second pFET 370 has a W/L ratio of approximately 40/1 while the second nFET 375 has a W/L ratio of approximately 3/1.

As shown in FIG. 3C, the second buffer stage 310 includes a first pFET 380 and a first NFET 385 coupled in series between a first potential node 390 and a second potential node 395. The first potential node 390 is coupled to receive a first potential and the second potential node 395 is coupled to receive a second potential lower than the first potential. The first potential node 390 may be coupled to receive a supply potential such as Vcc. The second potential node 395 may be coupled to receive a ground potential such as Vss. For one embodiment, the first potential node 390 of the second buffer circuit 310 and the first potential node 360 of the first buffer circuit 305 are each coupled to receive the same supply potential. For a further embodiment, the second potential node 395 of the second buffer circuit 310 and the second potential node 365 of the first buffer circuit 305 are each coupled to receive the same ground potential.

The first pFET 380 and the first nFET 385 each have their drains coupled to the output of the second buffer stage 310 and their gates coupled to the input of the second buffer stage 310 for receiving the data signal. The first pFET 380 is a weak p-channel device such that its conductance at activation is low relative to the conductance at activation of the first nFET 385. The result is that the first pFET 380 is capable of conducting a relatively small current at activation while the first nFET 385 is capable of sinking a relatively large current at activation. For one embodiment, the first pFET 380 has a W/L ratio that is smaller than a W/L ratio of the first nFET 385. For a further embodiment, the first pFET 380 has a W/L ratio of approximately 4/5 while the first nFET 385 has a W/L ratio of approximately 20/1.

As noted before, the data compression circuits 200 should be disabled in normal operation and enabled only during the desired testing. A method of disabling the data compression circuits 200 can further include disabling each second buffer stage 310. As shown in FIG. 3C, the second buffer stage 310 further includes a second pFET 400 and a second nFET 405. The second pFET 400 is coupled between the first potential node 390 and the first pFET 380 and has its gate coupled to receive the first enable signal enb. The second nFET 405 is coupled between the second potential node 395 and the first nFET 385 and has its gate coupled to receive the second enable signal en. The second enable signal en may be the binary complement of the first enable signal enb such that the second pFET 400 and the second nFET 405 are either both activated or both deactivated. The second pFET 400 and the second nFET 405 should be activated during the data compression test mode and deactivated during normal operation of the memory device. Deactivation of the second pFET 400 and the second nFET 405 disables the second buffer stage 310, thereby presenting a high impedance level at its output. For one embodiment, the second pFET 400 has the same width as the first pFET 380 and the second nFET 405 has the same width as the first nFET 385. Choosing the same width of these adjacent transistors simplifies fabrication of the transistors on a semiconductor substrate. For a further embodiment, the second pFET 400 has a W/L ratio of 4/1 while the second nFET 405 has a W/L ratio of 20/1.

The data compression test mode is entered or initiated in response to a sequence or pattern of one or more control signals received by the memory device. In the data compression test mode, the data compression circuits are activated or enabled. For example, the enable signals en and enb may be transitioned to appropriate logic levels to activate the first and second buffer circuits. A data pattern is written to the memory array either before or after enabling the data compression circuits. The memory array is then accessed to generate a page of output containing two or more words, each word containing one or more bits.

The data signal for each bit of a word in the page of output is compared to its corresponding bit for every other word of the page of output. If the bits for each bit location in a word match for every word in the page, the output drivers are not inhibited, i.e., the output drivers are allowed to be responsive to the output enable signal and their data signals. If a bit location in a word has a data signal value that is different from the corresponding bit location in any other word of the page, the output driver for that bit location is disabled regardless of the value of the output enable signal or the data signal. For another embodiment, if any bit location in a word has a data signal value that is different from the corresponding bit location in any other word of the page, the output drivers for all bit locations are disabled regardless of the value of the output enable signal or the data signals. The output enable signal is transitioned to a logic level indicative of a desire to output data; enabled output drivers will present a data signal on their outputs and disabled output drivers will present a high impedance on their outputs.

The conditions of the output drivers may be detected by the testing apparatus as differing potential levels, e.g., a data signal having a first logic level for an enabled output driver may be represented by a first potential level, a data signal having a second logic level for an enabled output driver may be represented by a second potential level and a data signal having any logic level for a disabled output driver may be represented by an intermediate potential level between the first potential level and the second potential level. The first potential level may be a supply potential such as Vcc, the second potential level may be a ground potential such as Vss, and the intermediate potential level may be approximately Vcc/2. In response to one or more disabled output drivers, when output is expected, the testing apparatus can deem the device under test (DUT) to be failed. Output is expected when the output enable signal, such as the control signal OE#, is provided to the DUT and has a logic level indicative of a desire to provide output.

Note that a bit location may contain the wrong data value in each word of the page. While this will not cause an output driver to be disabled, as each word will contain the same data value for the bit location, it will result in the wrong data provided on the DQ line. Accordingly, the testing apparatus must still compare the data value read from the memory array to the data pattern value written to the memory array to determine failure of the DUT if data signals are provided on each DQ line.

If the DUT passes for one word, e.g., the first word, read from the page, it is deemed to pass for each word of the page. Such testing would then repeat for additional pages of output of the DUT, reading just one word from each page to determine failure or acceptance of the device. A write verify test performed in accordance with the invention can dramatically improve time required for such testing. With device failure or acceptance determinable upon reading only one word from each page, the reading of remaining words of the page can be bypassed, thus eliminating the time that would have been required to read such additional words.

CONCLUSION

Memory devices have been described having a normal mode of operation and a test mode of operation. The test mode of operation includes a data compression test mode. In the data compression test mode, reading one word of an output page provides an indication of the data values of the remaining words of the output page. The time necessary to read and verify a repeating test pattern can be reduced as only one word of each output page need be read to determine the ability of the memory device to accurately write and store data values. The memory devices include data compression circuits to compare data values for each bit location of each word of the output page. Output is selectively disabled if a bit location for one word of the output page has a data value differing from any remaining word of the output page. Testing apparatus can detect the disabled output and deem a device failed if output is disabled when output is expected. By comparing the bit locations internal to the memory device, the testing apparatus need only read one word of each page to determine whether all words of the page match the repeating test pattern. By reading only one word of an output page, test time can be reduced to a fraction of the time required to read each word of the output page.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A data compression circuit in a memory device, comprising:
    a first logic circuit for receiving data signals corresponding to a given bit location of each word of an output page of the memory device and for providing a first output signal indicative of whether each data signal has a first logic level;
    a second logic circuit for receiving the data signals corresponding to the given bit location of each word of the output page of the memory device and for providing a second output signal indicative of whether each data signal has a second logic level different from the first logic level; and
    a third logic circuit for receiving the first output signal and the second output signal and for providing a third output signal indicative of whether each data signal has the same logic level.

2. The data compression circuit of claim 1, wherein the first logic circuit further comprises:
    a plurality of inputs, wherein the inputs are coupled to receive data signals corresponding to the given bit location of each word of the output page of the memory device; and an output, wherein the output of the first logic circuit has a first logic level when each input receives a data signal having a logic low level and a second logic level when any input receives a data signal having a logic high level.

3. The data compression circuit of claim 2, wherein the first logic level of the first logic circuit is a logic high level and the second logic level of the first logic circuit is a logic low level.

4. The data compression circuit of claim 1, wherein the second logic circuit further comprises:
   a plurality of inputs, wherein the inputs are coupled to receive data signals corresponding to the given bit location of each word of the output page of the memory device; and
   an output, wherein the output of the second logic circuit has a first logic level when each input receives a data signal having the logic high level and a second logic level when any input receives a data signal having the logic low level.

5. The data compression circuit of claim 4, wherein the first logic level of the second logic circuit is a logic low level and the second logic level of the second logic circuit is a logic high level.

6. The data compression circuit of claim 1, wherein the first logic circuit is an OR gate and the second logic circuit is an AND gate.

7. The data compression circuit of claim 1, wherein the first logic circuit is a NOR gate and the second logic circuit is a NAND gate.

8. The data compression circuit of claim 1, wherein the third logic circuit is an XOR gate.

9. The data compression circuit of claim 1, wherein the third logic circuit is an XNOR gate.

10. A data compression circuit in a memory device, comprising:
   a first logic circuit including a plurality of inputs coupled to receive data signals corresponding to a given bit location of each word of an output page of the memory device and further including an output for providing a first output signal having a first output logic level when each input receives a data signal having a first logic level and having a second output logic level when any input receives a data signal having a second logic level;
   a second logic circuit including a plurality of inputs coupled to receive the data signals corresponding to the given bit location of each word of the output page of the memory device and further including an output for providing a second output signal having a first output logic level when each input receives a data signal having the second logic level and a second output logic level when any input receives a data signal having the first logic level; and
   a third logic circuit coupled to receive the first output signal and the second output signal and to provide a third output signal indicative of whether each of the data signals has the same logic level.

11. The data compression circuit of claim 10, wherein the third logic circuit further comprises:
   a first input for receiving the first output signal;
   a second input for receiving the second output signal; and
   an output for providing the third output signal;
   wherein the third output signal has a first output logic level when the first output signal has its first output logic level;
   wherein the third output signal has its first logic level when the second output signal has its first output logic level; and wherein the third output signal has a second output logic level when the first output signal has its second output logic level and the second output signal has its second output logic level.

12. The data compression circuit of claim 10, wherein the first output logic level of the first output signal is different from the first output logic level of the second output signal.

13. The data compression circuit of claim 12, wherein the first output logic level of the first output signal is a logic high level, the second output logic level of the first output signal is a logic low level, the first output logic level of the second output signal is a logic low level and the second output logic level of the second output signal is a logic high level.

14. A data compression circuit in a memory device, comprising:
   a first logic circuit for receiving data signals corresponding to a given bit location of each word of an output page of the memory device and for providing a first output signal indicative of whether each data signal has a first logic level;
   a second logic circuit for receiving the data signals corresponding to the given bit location of each word of the output page of the memory device and for providing a second output signal indicative of whether each data signal has a second logic level different from the first logic level; and
   a third logic circuit for receiving the first output signal and the second output signal and for providing a third output signal indicative of whether each data signal has the same logic level;
   wherein the first logic circuit has a plurality of inputs and an output, wherein each input is coupled to receive a data signal corresponding to the given bit location of each word of the output page of the memory device in a one-to-one relationship, and wherein the output of the first logic circuit has a first logic level when each input receives a data signal having a logic low level and a second logic level when any input receives a data signal having a logic high level;
   wherein the second logic circuit has a plurality of inputs and an output, wherein each input is coupled to receive data signals corresponding to the given bit location of each word of the output page of the memory device in a one-to-one relationship, and wherein the output of the second logic circuit has a first logic level when each input receives a data signal having the logic high level and a second logic level when any input receives a data signal having the logic low level;
   wherein the third logic circuit has a first input for receiving the output of the first logic circuit, a second input for receiving the output of the second logic circuit, and an output;
   wherein the output of the third logic circuit has a first logic level when the output of the first logic circuit has its first logic level;
   wherein the output of the third logic circuit has its first logic level when the output of the second logic circuit has its first logic level; and
   wherein the output of the third logic circuit has a second logic level when the output of the first logic circuit has its second logic level and the output of the second logic circuit has its second logic level.

15. A data compression circuit in a memory device, comprising:
   a first logic circuit for receiving data signals corresponding to a given bit location of each word of an output page of the memory device and for providing a first output signal indicative of whether each data signal has a first logic level;

a second logic circuit for receiving the data signals corresponding to the given bit location of each word of the output page of the memory device and for providing a second output signal indicative of whether each data signal has a second logic level different from the first logic level; and a third logic circuit for receiving the first output signal and the second output signal and for providing a third output signal indicative of whether each data signal has the same logic level;

wherein the first logic circuit further comprises a plurality of first buffer stages, each first buffer stage having an input for receiving a data signal for the given bit location of a word of the output page of the memory device and having an output, wherein each first buffer stage is coupled to receive a data signal for the given bit location of a different word of the output page and wherein each first buffer stage has its output coupled to the outputs of the remaining first buffer stages;

wherein the second logic circuit further comprises a plurality of second buffer stages, each second buffer stage having an input for receiving a data signal for the given bit location of a word of the output page of the memory device and having an output, wherein each second buffer stage is coupled to receive a data signal for the given bit location of a different word of the output page and wherein each second buffer stage has its output coupled to the outputs of the remaining second buffer stages;

wherein the third logic circuit further comprises a first input coupled to the outputs of the first buffer stages, a second input coupled to the outputs of the second buffer stages, and an output for providing a control signal;

wherein the first input of the third logic circuit has a first logic level when the data signal for the given bit location of each word of the output page has a logic low level and the first input of the third logic circuit has a second logic level when the data signal for the given bit location of any word of the output page has a logic high level;

wherein the second input of the third logic circuit has a first logic level when the data signal for the given bit location of each word of the output page has a logic high level and the second input of the third logic circuit has a second logic level when the data signal for the given bit location of any word of the output page has a logic low level;

wherein the control signal has a first logic level when the first input of the third logic circuit has its first logic level;

wherein the control signal has a first logic level when the second input of the third logic circuit has its first logic level; and wherein the control signal has a second logic level when the first input of the third logic circuit and the second input of the third logic circuit each have their second logic levels.

16. The data compression circuit of claim 15, wherein each first buffer stage sinks a first current level in response to a data signal having a logic high level and drives a second, larger, current level in response to a data signal having a logic low level.

17. The data compression circuit of claim 16, wherein the second current level for one first buffer stage is larger in magnitude than the first current level for each remaining first buffer stage combined.

18. The data compression circuit of claim 15, wherein each second buffer stage sinks a first current level in response to a data signal having a logic high level and drives a second, smaller, current level in response to a data signal having a logic low level.

19. The data compression circuit of claim 18, wherein the first current level for one second buffer stage is larger in magnitude than the second current level for each remaining second buffer stage combined.

20. The data compression circuit of claim 15, wherein each first buffer stage is coupled to receive a data signal corresponding to a different word of the output page and wherein there is one first buffer stage for each word of the output page.

21. The data compression circuit of claim 15, wherein each second buffer stage is coupled to receive a data signal corresponding to a different word of the output page and wherein there is one second buffer stage for each word of the output page.

22. The data compression circuit of claim 15, wherein each first buffer stage and each second buffer stage are further coupled to receive at least one control signal for selectively disabling the buffer stages.

23. The data compression circuit of claim 22, wherein each first buffer stage is a tri-state buffer circuit and the at least one control signal selectively tri-states each first buffer stage.

24. The data compression circuit of claim 22, wherein each second buffer stage is a tri-state buffer circuit and the at least one control signal selectively tri-states each second buffer stage.

25. A data compression circuit in a memory device, comprising:

a first logic circuit for receiving data signals corresponding to a given bit location of each word of an output page of the memory device and for providing a first output signal indicative of whether each data signal has a first logic level;

a second logic circuit for receiving the data signals corresponding to the given bit location of each word of the output page of the memory device and for providing a second output signal indicative of whether each data signal has a second logic level different from the first logic level; and a third logic circuit for receiving the first output signal and the second output signal and for providing a third output signal indicative of whether each data signal has the same logic level;

wherein the first logic circuit further comprises a plurality of first buffer stages, each first buffer stage having an input coupled to receive a data signal for the given bit location of a word of the output page of the memory device and having an output, wherein the outputs of the first buffer stages are commonly coupled and wherein each first buffer stage further comprises:

a first p-channel field-effect transistor having a gate coupled to the input of its first buffer stage, a source coupled to a first potential node, and a drain coupled to the output of its first buffer stage; and a first n-channel field-effect transistor having a gate coupled to the input of its first buffer stage, a source coupled to a second potential node, and a drain coupled to the output of its first buffer stage;

wherein the first potential node is coupled to receive a first potential and the second potential node is coupled to receive a second potential lower than the first potential; and wherein the first p-channel field-effect transistor is sized to have a conductance at activation that is higher than a conductance at activation for the first n-channel field-effect transistor;

wherein the second logic circuit further comprises a plurality of second buffer stages, each second buffer stage having an input coupled to receive a data signal for the given bit location of a word of the output page of the memory device and having an output, wherein the outputs of the second buffer stages are commonly coupled and wherein each second buffer stage further comprises:

a first p-channel field-effect transistor having a gate coupled to the input of its second buffer stage, a source coupled to a first potential node, and a drain coupled to the output of its second buffer stage; and a first n-channel field-effect transistor having a gate coupled to the input of its second buffer stage, a source coupled to a second potential node, and a drain coupled to the output of its second buffer stage;

wherein the first potential node is coupled to receive a first potential and the second potential node is coupled to receive a second potential lower than the first potential; and wherein the first p-channel field-effect transistor is sized to have a conductance at activation that is lower than a conductance at activation for the first n-channel field-effect transistor; and wherein the third logic circuit further comprises a first input coupled to the commonly coupled outputs of the first buffer stages, a second input coupled to the commonly coupled outputs of the second buffer stages and an output, wherein the output has a first logic level when logic levels received at the first and second inputs are the same and a second logic level when logic levels received at the first and second inputs differ.

26. The data compression circuit of claim 25, wherein the first p-channel field-effect transistor of a first buffer stage has a larger W/L ratio than the first n-channel field-effect transistor of the first buffer stage.

27. The data compression circuit of claim 26, wherein the first p-channel field-effect transistor of the first buffer stage has a W/L ratio of approximately 40/1 and the first n-channel field-effect transistor of the first buffer stage has a W/L ratio of approximately 3/10.

28. The data compression circuit of claim 25, wherein the first p-channel field-effect transistor of a second buffer stage has a smaller W/L ratio than the first n-channel field-effect transistor of the second buffer stage.

29. The data compression circuit of claim 28, wherein the first p-channel field-effect transistor of the second buffer stage has a W/L ratio of approximately 4/5 and the first n-channel field-effect transistor of the second buffer stage has a W/L ratio of approximately 20/1.

30. The data compression circuit of claim 25, wherein each first buffer stage is coupled to receive a data signal corresponding to a different word of the output page and wherein there is one first buffer stage for each word of the output page.

31. The data compression circuit of claim 25, wherein each second buffer stage is coupled to receive a data signal corresponding to a different word of the output page and wherein there is one second buffer stage for each word of the output page.

32. The data compression circuit of claim 25, wherein the first potential node of a first buffer stage is coupled to receive a supply potential.

33. The data compression circuit of claim 25, wherein the second potential node of a first buffer stage is coupled to receive a ground potential.

34. The data compression circuit of claim 25, wherein the first potential node of a second buffer stage is coupled to receive a supply potential.

35. The data compression circuit of claim 25, wherein the second potential node of a second buffer stage is coupled to receive a ground potential.

36. The data compression circuit of claim 25, wherein the first potential node of each first buffer stage and the first potential node of each second buffer stage are each coupled to receive the same supply potential.

37. The data compression circuit of claim 25, wherein the second potential node of each first buffer stage and the second potential node of each second buffer stage are each coupled to receive the same ground potential.

38. The data compression circuit of claim 25, further comprising:

wherein each first buffer stage further comprises a second p-channel field-effect transistor coupled between the first potential node and the first p-channel field-effect transistor and a second n-channel field-effect transistor coupled between the second potential node and the first n-channel field-effect transistor;

wherein the second p-channel field-effect transistor has a gate coupled to receive a first enable signal; and wherein the second n-channel field-effect transistor has a gate coupled to receive a second enable signal different from the first enable signal.

39. The data compression circuit of claim 38, wherein the second enable signal is the binary complement of the first enable signal.

40. The data compression circuit of claim 25, further comprising:

wherein each second buffer stage further comprises a second p-channel field-effect transistor coupled between the first potential node and the first p-channel field-effect transistor and a second n-channel field-effect transistor coupled between the second potential node and the first n-channel field-effect transistor;

wherein the second p-channel field-effect transistor has a gate coupled to receive a first enable signal; and wherein the second n-channel field-effect transistor has a gate coupled to receive a second enable signal different from the first enable signal.

41. The data compression circuit of claim 40, wherein the second enable signal is the binary complement of the first enable signal.

42. A memory device, comprising:

a data compression circuit having a plurality of inputs for receiving data signals and an output for providing a first control signal, wherein the data compression circuit has its inputs coupled to receive data signals representative of data values for a given bit location of each word of a page of output of the memory device, and wherein the first control signal has a first logic level when the data signals for the given bit location match and a second logic level when any data signal for the given bit location differs; and an output driver circuit for providing an output signal indicative of a data signal, wherein the output driver circuit is disabled when the first control signal has the second logic level.

43. The memory device of claim 42, wherein the output driver circuit is responsive to a second control signal and its data signal when the first control signal has the first logic level.

44. The memory device of claim 43, wherein the second control signal is a global output enable signal.

45. The memory device of claim 43, wherein the first control signal and the second control signal are combined as part of a global inhibit signal and the output driver circuit is responsive to the global inhibit signal.

46. The memory device of claim 42, wherein the data compression circuit comprises:
- a first logic circuit for receiving the data signals corresponding to the given bit location of each word of the output page of the memory device and for providing a first output signal indicative of whether each data signal has a first logic level;
- a second logic circuit for receiving the data signals corresponding to the given bit location of each word of the output page of the memory device and for providing a second output signal indicative of whether each data signal has a second logic level different from the first logic level; and
- a third logic circuit for receiving the first output signal and the second output signal and for providing the first control signal indicative of whether each data signal has the same logic level.

47. The memory device of claim 42, wherein the data compression circuit comprises:
- a first logic circuit comprising:
  - a plurality of inputs, wherein the inputs are coupled to receive the data signals corresponding to the given bit location of each word of the output page of the memory device; and
  - an output, wherein the output of the first logic circuit has a first logic level when each input receives a data signal having a logic low level and a second logic level when any input receives a data signal having a logic high level;
- a second logic circuit comprising:
  - a plurality of inputs, wherein the inputs are coupled to receive the data signals corresponding to the given bit location of each word of the output page of the memory device; and
  - an output, wherein the output of the second logic circuit has a first logic level when each input receives a data signal having the logic high level and a second logic level when any input receives a data signal having the logic low level; and
- a third logic circuit comprising:
  - a first input for receiving the output of the first logic circuit;
  - a second input for receiving the output of the second logic circuit; and
  - an output for providing the first control signal;
  - wherein the first control signal has its first logic level when the output of the first logic circuit has its first logic level;
  - wherein first control signal has its first logic level when the output of the second logic circuit has its first logic level; and
  - wherein the first control signal has its second logic level when the output of the first logic circuit has its second logic level and the output of the second logic circuit has its second logic level.

48. The memory device of claim 47, wherein the first logic level of the first logic circuit is different from the first logic level of the second logic circuit.

49. The memory device of claim 48, wherein the first logic level of the first logic circuit is a logic high level, the second logic level of the first logic circuit is a logic low level, the first logic level of the second logic circuit is a logic low level and the second logic level of the second logic circuit is a logic high level.

50. The memory device of claim 42, wherein the data compression circuit comprises:
- a plurality of first buffer stages, each first buffer stage having an input coupled to receive a data signal for the given bit location of a word of the output page of the memory device and having an output, wherein the outputs of the first buffer stages are commonly coupled and wherein each first buffer stage further comprises:
  - a first p-channel field-effect transistor having a gate coupled to the input of its first buffer stage, a source coupled to a first potential node, and a drain coupled to the output of its first buffer stage; and
  - a first n-channel field-effect transistor having a gate coupled to the input of its first buffer stage, a source coupled to a second potential node, and a drain coupled to the output of its first buffer stage;
  - wherein the first potential node is coupled to receive a first potential and the second potential node is coupled to receive a second potential lower than the first potential; and
  - wherein the first p-channel field-effect transistor is sized to have a conductance at activation that is higher than a conductance at activation for the first n-channel field-effect transistor;
- a plurality of second buffer stages, each second buffer stage having an input coupled to receive a data signal for the given bit location of a word of the output page of the memory device and having an output, wherein the outputs of the second buffer stages are commonly coupled and wherein each second buffer stage further comprises:
  - a first p-channel field-effect transistor having a gate coupled to the input of its second buffer stage, a source coupled to a first potential node, and a drain coupled to the output of its second buffer stage; and
  - a first n-channel field-effect transistor having a gate coupled to the input of its second buffer stage, a source coupled to a second potential node, and a drain coupled to the output of its second buffer stage;
  - wherein the first potential node is coupled to receive a first potential and the second potential node is coupled to receive a second potential lower than the first potential; and
  - wherein the first p-channel field-effect transistor is sized to have a conductance at activation that is lower than a conductance at activation for the first n-channel field-effect transistor; and
- a logic circuit having a first input coupled to the commonly coupled outputs of the first buffer stages, a second input coupled to the commonly coupled outputs of the second buffer stages and an output for providing the first control signal, wherein the first control signal has its first logic level when logic levels received at the first and second inputs of the logic circuit are the same and its second logic level when logic levels received at the first and second inputs of the logic circuit differ.

51. The memory device of claim 50, wherein the first p-channel field-effect transistor of a first buffer stage has a larger W/L ratio than the first n-channel field-effect transistor of the first buffer stage.

52. The memory device of claim 51, wherein the first p-channel field-effect transistor of the first buffer stage has a W/L ratio of approximately 40/1 and the first n-channel field-effect transistor of the first buffer stage has a W/L ratio of approximately 3/10.

53. The memory device of claim 50, wherein the first p-channel field-effect transistor of a second buffer stage has a smaller W/L ratio than the first n-channel field-effect transistor of the second buffer stage.

54. The memory device of claim 53, wherein the first p-channel field-effect transistor of the second buffer stage has a W/L ratio of approximately 4/5 and the first n-channel field-effect transistor of the second buffer stage has a W/L ratio of approximately 20/1.

55. The memory device of claim 50, wherein each first buffer stage is coupled to receive a data signal corresponding to a different word of the output page and wherein there is one first buffer stage for each word of the output page.

56. The memory device of claim 50, wherein each second buffer stage is coupled to receive a data signal corresponding to a different word of the output page and wherein there is one second buffer stage for each word of the output page.

57. The memory device of claim 50, wherein the first potential node of each first buffer stage and the first potential node of each second buffer stage are each coupled to receive the same supply potential.

58. The memory device of claim 50, wherein the second potential node of each first buffer stage and the second potential node of each second buffer stage are each coupled to receive the same ground potential.

59. The memory device of claim 50, further comprising:
wherein each first buffer stage further comprises a second p-channel field-effect transistor coupled between the first potential node and the first p-channel field-effect transistor and a second n-channel field-effect transistor coupled between the second potential node and the first n-channel field-effect transistor;
wherein the second p-channel field-effect transistor has a gate coupled to receive a first enable signal; and
wherein the second n-channel field-effect transistor has a gate coupled to receive a second enable signal different from the first enable signal.

60. The memory device of claim 59, wherein the second enable signal is the binary complement of the first enable signal.

61. The memory device of claim 50, further comprising:
wherein each second buffer stage further comprises a second p-channel field-effect transistor coupled between the first potential node and the first p-channel field-effect transistor and a second n-channel field-effect transistor coupled between the second potential node and the first n-channel field-effect transistor;
wherein the second p-channel field-effect transistor has a gate coupled to receive a first enable signal; and
wherein the second n-channel field-effect transistor has a gate coupled to receive a second enable signal different from the first enable signal.

62. The memory device of claim 61, wherein the second enable signal is the binary complement of the first enable signal.

63. The memory device of claim 42, wherein the memory device is coupled to a processor.

64. A memory device, comprising:
a first data compression circuit having a plurality of inputs for receiving data signals and an output for providing a first control signal, wherein the data compression circuit has its inputs coupled to receive data signals representative of data values for a given bit location of each word of a page of output of the memory device, and wherein the first control signal has a first logic level when the data signals for the given bit location match and a second logic level when any data signal for the given bit location differs;
an second data compression circuit having a plurality of inputs for receiving data signals and an output for providing a second control signal, wherein the second data compression circuit has its inputs coupled to receive data signals representative of data values for a different given bit location of each word of the page of output of the memory device, and wherein the second control signal has a first logic level when the data signals for the different given bit location match and a second logic level when any data signal for the different given bit location differs;
a first output driver circuit for providing an output signal indicative of a data signal, wherein the first output driver circuit is disabled when the first control signal has the second logic level; and
a second output driver circuit for providing an output signal indicative of a data signal, wherein the second output driver circuit is disabled when the second control signal has the second logic level.

65. The memory device of claim 64, wherein the additional output driver circuit is responsive to the second control signal and its data signal when a third control signal has the first logic level.

66. The memory device of claim 65, wherein the second output driver circuit is disabled when either the second control signal or the third control signal has its second logic level.

67. The memory device of claim 64, wherein the first control signal and a third control signal are combined as part of a global inhibit signal and each output driver circuit is responsive to the global inhibit signal.

68. The memory device of claim 64, wherein the control signal from each data compression circuit and a third control signal are ORed to generate a combined control signal, and wherein each output driver circuit is responsive to the combined control signal.

69. The memory device of claim 64, wherein each output driver circuit is disabled if any control signal of a data compression circuit is indicative of a mismatch between a data value for a bit location of a first word of the output page and data value for its corresponding bit location of any remaining word of the output page.

70. The memory device of claim 64, further comprising one data compression circuit and one output driver circuit corresponding to each bit location of a word of the output page of the memory device.

71. A memory device, comprising:
a data compression circuit having a plurality of inputs for receiving data signals and an output for providing a first control signal, wherein the data compression circuit has its inputs coupled to receive data signals representative of data values for a given bit location of each word of a page of output of the memory device, and wherein the first control signal has a first logic level when the data signals for the given bit location match and a second logic level when any data signal for the given bit location differs; and
an output driver circuit for providing an output signal indicative of a data signal, wherein the output driver circuit is disabled when the first control signal has the second logic level;

wherein the data compression circuit further comprises:
a plurality of first buffer stages, each first buffer stage having an input for receiving a data signal for the given bit location of a word of the output page of the memory device and having an output, wherein each first buffer stage is coupled to receive a data signal for the given bit location of a different word of the output page and wherein each first buffer stage has its output coupled to the outputs of the remaining first buffer stages;
a plurality of second buffer stages, each second buffer stage having an input for receiving a data signal for the given bit location of a word of the output page of the memory device and having an output, wherein each second buffer stage is coupled to receive a data signal for the given bit location of a different word of the output page and wherein each second buffer stage has its output coupled to the outputs of the remaining second buffer stages; and
a logic circuit having a first input coupled to the outputs of the first buffer stages, a second input coupled to the outputs of the second buffer stages, and an output for providing the first control signal;
wherein the first input of the logic circuit has a first logic level when the data signal for the given bit location of each word of the output page has a logic low level and the first input of the logic circuit has a second logic level when the data signal for the given bit location of any word of the output page has a logic high level;
wherein the second input of the logic circuit has a first logic level when the data signal for the given bit location of each word of the output page has a logic high level and the second input of the logic circuit has a second logic level when the data signal for the given bit location of any word of the output page has a logic low level;
wherein the first control signal has its first logic level when the first input of the logic circuit has its first logic level;
wherein the first control signal has its first logic level when the second input of the logic circuit has its first logic level; and
wherein the first control signal has its second logic level when the first input of the logic circuit and the second input of the logic circuit each have their second logic levels.

72. The memory device of claim 71, wherein each first buffer stage is coupled to receive a data signal corresponding to a different word of the output page and wherein there is one first buffer stage for each word of the output page.

73. The memory device of claim 71, wherein each second buffer stage is coupled to receive a data signal corresponding to a different word of the output page and wherein there is one second buffer stage for each word of the output page.

74. The memory device of claim 71, wherein each first buffer stage and each second buffer stage are further coupled to receive at least one control signal for selectively disabling the buffer stages.

75. The memory device of claim 71, wherein each first buffer stage sinks a first current level in response to a data signal having a logic high level and drives a second, larger, current level in response to a data signal having a logic low level.

76. The memory device of claim 75, wherein the second current level for one first buffer stage is larger in magnitude than the first current level for each remaining first buffer stage combined.

77. The memory device of claim 71, wherein each second buffer stage sinks a first current level in response to a data signal having a logic high level and drives a second, smaller, current level in response to a data signal having a logic low level.

78. The memory device of claim 77, wherein the first current level for one second buffer stage is larger in magnitude than the second current level for each remaining second buffer stage combined.

79. A method of testing a memory device, comprising:
accessing a memory array to generate a page of output containing at least two words, wherein the page of output has a repeating data pattern and each word has at least one bit location;
comparing data signals for a given bit location of each word of the page of output;
disabling output for data signals corresponding to at least the given bit location if at least one data signal for the given bit location differs from any remaining data signal for the given bit location;
attempting to read a word of the page of output; and
determining whether output is disabled for at least the given bit location, wherein disabled output is indicative of failure of the memory device.

80. The method of claim 79, wherein attempting to read a word of the page of output comprises attempting to read only one word of the page of output.

81. The method of claim 79, further comprising:
writing the repeating data pattern to the memory array prior to accessing the memory array.

82. The method of claim 81, wherein the repeating data pattern is a repeating pattern of all zeros.

83. The method of claim 81, wherein the repeating data pattern is a repeating pattern of all ones.

84. The method of claim 81, wherein the repeating data pattern is a checkerboard pattern.

85. The method of claim 81, wherein the repeating data pattern is a reverse checkerboard pattern.

86. The method of claim 79, further comprising:
repeating the method for each page of output of the memory device.

87. The method of claim 79, wherein further comprising:
repeating the method for each page of output of the memory device and attempting to read only one word of each page of output.

88. A method of testing a memory device, comprising:
accessing a memory array to generate a page of output containing at least two words, wherein the page of output has a repeating data pattern and each word has at least one bit location;
comparing data signals for a given bit location of each word of the page of output;
disabling output for data signals corresponding to at least the given bit location if at least one data signal for the given bit location differs from any remaining data signal for the given bit location;
attempting to read a word of the page of output;
determining whether output is disabled for at least the given bit location, wherein disabled output is indicative of failure of the memory device;
comparing data signals for an additional given bit location of each word of the page of output concurrently with comparing data signals for the given bit location; and
disabling output for data signals corresponding to at least the additional given bit location if at least one data signal for the additional given bit location differs from any remaining data signal for the additional given bit location.

89. A method of testing a memory device, comprising:

accessing a memory array to generate a page of output containing at least two words, wherein the page of output has a repeating data pattern and each word has at least one bit location;

comparing data signals for a given bit location of each word of the page of output;

disabling output for data signals corresponding to at least the given bit location if at least one data signal for the given bit location differs from any remaining data signal for the given bit location;

attempting to read a word of the page of output;

determining whether output is disabled for at least the given bit location, wherein disabled output is indicative of failure of the memory device;

comparing data signals for an additional given bit location of each word of the page of output concurrently with comparing data signals for the given bit location;

disabling output for all data signals if at least one data signal for the given bit location differs from any remaining data signal for the given bit location; and disabling output for all data signals if at least one data signal for the additional given bit location differs from any remaining data signal for the additional given bit location.

90. The method of claim 89, wherein disabling output further comprises disabling an output driver circuit.

91. The method of claim 90, wherein disabling an output driver circuit further comprises tri-stating the output driver circuit.

92. The method of claim 89, wherein comparing data signals for a given bit location of each word of the page of output comprises applying the data signals to a first logic circuit and a second logic circuit, wherein the first logic circuit is configured to provide a first output signal indicative of whether each data signal has a first logic level, and wherein the second logic circuit is configured to provide a second output signal indicative of whether each data signal has a second logic level different from the first logic level.

93. The method of claim 92, wherein comparing data signals for a given bit location of each word of the page of output further comprises generating a control signal from the first output signal and the second output signal indicative of whether each data signal has the same logic level.

94. A method of testing a memory device, comprising:

accessing a memory array to generate a page of output containing at least two words, wherein the page of output has a repeating data pattern and each word has at least one bit location;

comparing data signals for a given bit location of each word of the page of output;

disabling output for data signals corresponding to at least the given bit location if at least one data signal for the given bit location differs from any remaining data signal for the given bit location;

attempting to read a word of the page of output;

determining whether output is disabled for at least the given bit location, wherein disabled output is indicative of failure of the memory device;

comparing a data value read from the memory array to a data pattern value written to the memory array; and indicating failure of the memory device if the data value read from the memory array differs from the data pattern value written to the memory array regardless of whether any output is disabled.

95. The method of claim 94, further comprising:

repeating the method for each page of output of the memory device.

96. The method of claim 94, wherein further comprising:

repeating the method for each page of output of the memory device and attempting to read only one word of each page of output.

* * * * *